(12) United States Patent
Zaslavsky et al.

(10) Patent No.: US 9,265,016 B1
(45) Date of Patent: Feb. 16, 2016

(54) POWER CONTROL USING FAST SIGNAL TIME ALIGNMENT

(71) Applicant: Marvell International Ltd., Hamilton (BM)

(72) Inventors: Alexander Zaslavsky, Petach-Tikva (IL); Rony Ashkenazi, Moshav Kidron (IL)

(73) Assignee: MARVELL INTERNATIONAL LTD, Hamilton (BM)

( * ) Notice: Subject to any disclaimer, the term of this patent is extended or adjusted under 35 U.S.C. 154(b) by 0 days.

(21) Appl. No.: 14/306,281

(22) Filed: Jun. 17, 2014

Related U.S. Application Data

(63) Continuation of application No. 13/351,273, filed on Jan. 17, 2012, now Pat. No. 8,781,536, which is a continuation-in-part of application No. 12/397,366, filed on Mar. 4, 2009, now Pat. No. 8,099,139.

(60) Provisional application No. 61/034,285, filed on Mar. 6, 2008, provisional application No. 61/566,877, filed on Dec. 5, 2011.

(51) Int. Cl.
*H04B 1/38* (2015.01)
*H04W 52/52* (2009.01)
*H04B 1/04* (2006.01)

(52) U.S. Cl.
CPC ............... *H04W 52/52* (2013.01); *H04B 1/04* (2013.01); *H04B 2001/0416* (2013.01)

(58) Field of Classification Search
None
See application file for complete search history.

(56) References Cited

U.S. PATENT DOCUMENTS 6,091,942 A * 7/2000 Buer et al. ............... 455/234.1
2009/0156143 A1* 6/2009 Shute ...................... 455/127.2

* cited by examiner

*Primary Examiner* — Anh Tran

(57) ABSTRACT

A method for controlling output signal power in a communication terminal includes accepting, from first and second measurement points along a transmission chain in a transmitter of the terminal, respective first and second signal representations of a communication signal to be transmitted by the communication terminal. A cross-correlation is computed between the first and second signal representations accepted from the first and second measurement points. An actual gain between the first and second measurement points is computed using the cross-correlation. An output power of the communication signal is adjusted by setting a gain of the transmitter responsively to the actual gain.

23 Claims, 5 Drawing Sheets

US 9,265,016 B1

POWER CONTROL USING FAST SIGNAL TIME ALIGNMENT

CROSS-REFERENCE TO RELATED APPLICATIONS

This application is continuation of U.S. patent application Ser. No. 13/351,273, filed Jul. 17, 2012, which is a continuation in part of U.S. patent application Ser. No. 12/397,366, filed Mar. 4, 2009, which claims the benefit of U.S. Provisional Patent Application 61/034,285, filed Mar. 6, 2008. U.S. patent application Ser. No. 13/351,273 also claims the benefit of U.S. Provisional Patent Application 61/566,877, filed Dec. 5, 2011. The disclosures of all these related applications are incorporated herein by reference.

FIELD OF THE DISCLOSURE

The present disclosure relates generally to communication systems, and particularly to methods and systems for power control in communication terminals.

BACKGROUND

Various communication systems modify the power of transmitted signals in order to adapt to current channel conditions. Such techniques are commonly referred to as power control. For example, Technical Specification Group (TSG) RAN WG4 of the $3^{rd}$ Generation Partnership Project (3GPP) specifies the transmission and reception characteristics of Universal Mobile Telecommunications System (UMTS) User Equipment (UE) in a specification entitled "UE Radio Transmission and Reception (FDD)," TS 25.101, version 8.5.1, January, 2009, which is incorporated herein by reference. Section 6.4 of this specification defines power control mechanisms for limiting interference levels. In particular, section 6.4.2 defines an uplink power control process, in which the UE adjusts its output power in accordance with Transmit Power Control (TPC) commands received in the downlink.

SUMMARY

An embodiment that is described herein provides a method for controlling output signal power in a communication terminal. The method includes accepting, from first and second measurement points along a transmission chain in a transmitter of the terminal, respective first and second signal representations of a communication signal to be transmitted by the communication terminal. A cross-correlation is computed between the first and second signal representations accepted from the first and second measurement points. An actual gain between the first and second measurement points is computed using the cross-correlation. An output power of the communication signal is adjusted by setting a gain of the transmitter responsively to the actual gain.

In some embodiments, accepting the first and second signal representations includes accepting first and second baseband representations at the first and the second measurement points, respectively. In an embodiment, accepting the baseband representations includes accepting the second baseband representation from an I/Q demodulator that down-converts a Radio Frequency (RF) signal at the second measurement point.

In a disclosed embodiment, accepting the signal representations includes determining respective first and second signal envelopes of the first and second signal representations at the first and the second measurement points, and computing the cross-correlation between the first and second envelopes. In another embodiment, accepting the signal representations includes applying low-pass filtering to the first and second signal representations before computing the cross-correlation.

In some embodiments, computing the actual gain includes determining a maximum of the cross-correlation, measuring an average power of the first signal representation and normalizing the maximum of the cross-correlation by the average power. In an embodiment, adjusting the output power includes receiving a request from a base station to adjust the output power, and adjusting the output power responsively to the request. In another embodiment, adjusting the output power includes determining a desired gain setting between the first and second measurement points, and correcting the output power responsively to a difference between the desired gain setting and the actual gain.

In yet another embodiment, adjusting the output power includes initially adjusting the output power based on predefined gain values, and correcting the initially-adjusted output power responsively to the computed actual gain. In still another embodiment, the method includes processing the communication signal by the transmission chain so as to transmit the communication signal at the adjusted output power.

In an embodiment, accepting the signal representations includes accepting the representations of the communication signal that is modulated in accordance with a Code-Division Multiple Access (CDMA) modulation. In the present context, the term CDMA refers to various CDMA flavors such as Wideband CDMA, CDMA2000 or other suitable modulations. In an alternative embodiment, accepting the baseband representations includes accepting the representations of the communication signal that is modulated in accordance with a Long Term Evolution (LTE) specification.

In a disclosed embodiment, accepting the signal representations includes accepting the first signal representation derived from a digital signal at the first measurement point, and accepting the second signal representation derived from an analog signal at the second measurement point. In an embodiment, adjusting the output power includes controlling at least one variable-gain component in the transmission chain. In another embodiment, the communication signal conforms to a communication protocol that assigns time intervals for power control and stabilization, and accepting the signal representations, computing the cross-correlation and the actual gain, and adjusting the output power are performed during the time intervals.

There is additionally provided, in accordance with an embodiment that is described herein, a communication apparatus including a transmission chain and control circuitry. The transmission chain is operative to process and transmit a communication signal at a requested output power. The control circuitry is configured to accept, from first and second measurement points along the transmission chain, respective first and second signal representations of a communication signal to be transmitted by the communication terminal, to compute a cross-correlation between the first and second signal representations accepted from the first and second measurement points, to compute an actual gain between the first and second measurement points using the cross-correlation, and to adjust an output power of the communication signal by setting a gain of the transmitter responsively to the actual gain.

In some embodiments, a mobile communication terminal includes the disclosed apparatus. In some embodiments, a chipset for processing signals in a mobile communication terminal includes the disclosed apparatus.

The present disclosure will be more fully understood from the following detailed description of the embodiments thereof, taken together with the drawings in which:

DETAILED DESCRIPTION OF EMBODIMENTS

Figure 1:
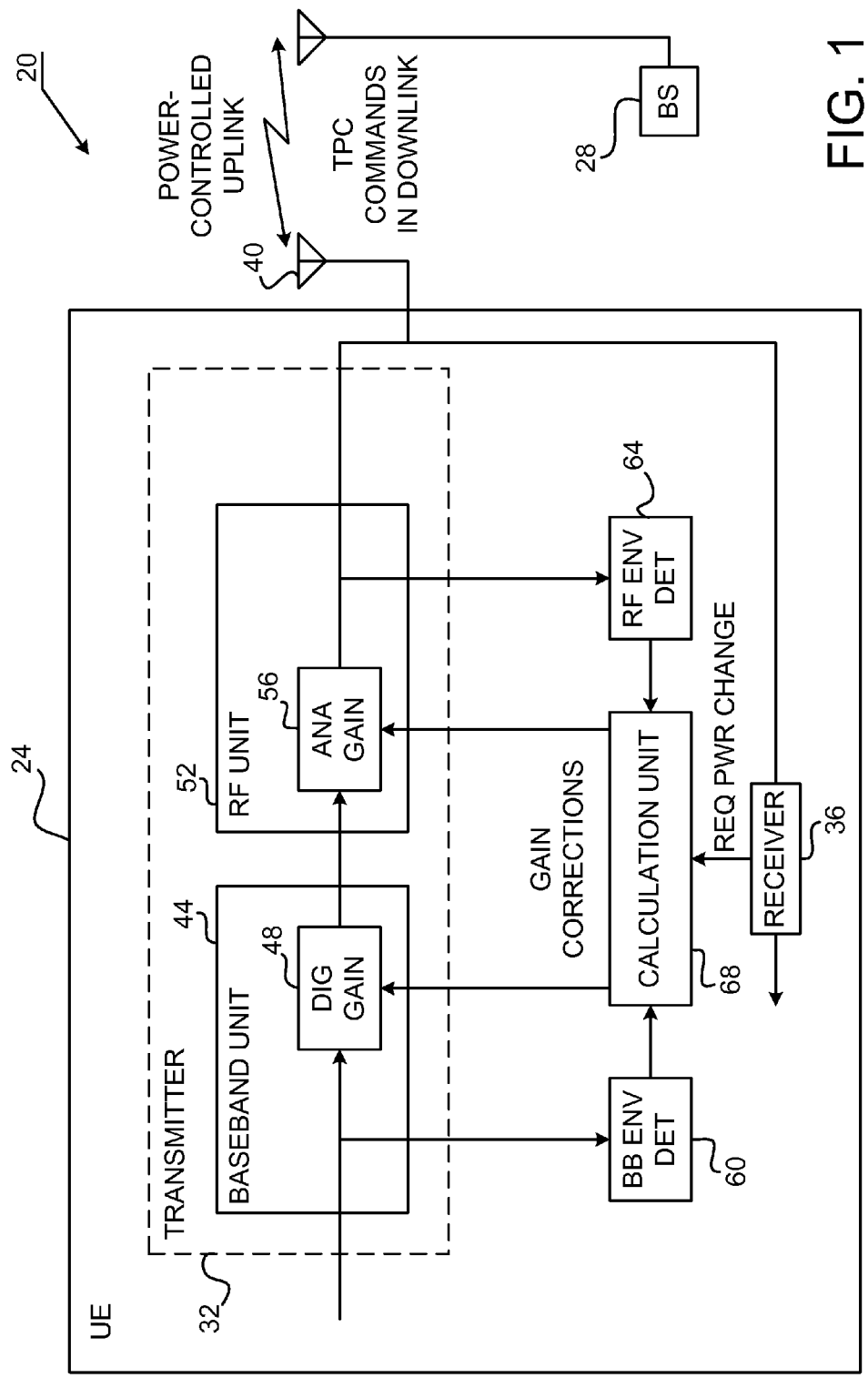
FIG. 1 is a block diagram that schematically illustrates a wireless communication system, in accordance with an embodiment that is described herein.

In a typical implementation of uplink power control, a wireless communication terminal receives a command from a base station to change its output power by a certain amount. In response to the command, the terminal adjusts the gain of its transmitter in order to set the requested output power. The required accuracy of the output power setting is typically achieved by using a calibration process, in which the output power is measured as a function of the transmitter gain setting. Such a calibration process typically produces control characteristics (e.g., gain/power curves), which are used for output power setting.

In practice, however, the actual transmitter gain often varies relative to the calibrated curve, for example due to variations in temperature, transmit frequency, supply voltage and other operating conditions. These variations typically cause power control inaccuracy. This sort of inaccuracy may be significant, for example, at output power levels that approach saturation, and also in transmitters that activate and deactivate different Power Amplifier (PA) stages at different output power levels. In many cases, this inaccuracy in the transmitter power control may prevent the terminal from meeting the requirements imposed by communication standards.

Embodiments that are described hereinbelow provide improved methods and systems for power control in wireless communication terminals. In some embodiments, upon receiving a request to change the transmitter output power, the communication terminal measures the actual gain of its transmitter, at the actual output power and using the actual uplink signal. Based on the measured actual gain of the transmitter, the terminal computes the gain correction that is needed in order to achieve the requested output power change. Since the computed gain correction accounts for gain variations at the actual operating conditions, it is highly accurate.

In some embodiments, the communication terminal measures the actual transmitter gain by determining two envelopes of the uplink signal: One envelope is determined for a signal at the digital baseband section, and the second envelope is determined for a signal at the Radio Frequency (RF) output of the transmitter's power amplifier (PA). The terminal computes a cross-correlation between the two signal envelopes, identifies the maximum value of the cross-correlation and normalizes this maximum value by the average power of the baseband signal envelope. The resulting value approximates the actual gain between the two measurement points with high accuracy. The cross-correlation technique is highly accurate in time-aligning the two envelopes, and is therefore suitable for signals whose envelope changes rapidly with time, such as UMTS signals.

In other embodiments, the actual transmitter gain is determined in a similar manner but without determining signal envelopes. In some embodiments, the communication terminal measures the actual transmitter gain based on two signal representations, e.g., baseband representations, of the uplink signal that are obtained from two respective measurement points along the transmission chain. In an example embodiment, one baseband representation is obtained from the digital baseband signal before conversion to analog, and other baseband representation is obtained from an I/Q demodulator that down-converts the RF output of the transmitter PA. The communication terminal computes a cross-correlation between the two baseband representations, optionally following low-pass filtering, and computes the actual transmitter gain based on the cross-correlation.

The disclosed methods do not rely on a-priori calibration of the transmitter gain as a function of operating conditions (e.g., temperature or supply voltage), since each gain correction is calculated in real time based on the currently-present operating conditions. This feature can shorten or even eliminate the calibration process that is performed during production of the communication terminal. The shorter calibration time reduces the cost of the communication terminal considerably.

Since the methods and systems described herein calculate gain corrections based on the actual gain of the transmitter and on the actual signal processed by the transmitter at the actual operation conditions, they are highly accurate in compensating for gain variations. A power control process that uses these methods can tolerate high gain variations, and can function properly in non-linear regions of the transmitter, in which known power control processes may fail. The disclosed methods may be especially useful when using high-power and high-efficiency PAs with switched power modes. The disclosed methods are particularly suitable for communication systems that allocate dedicated short time intervals for power control and stabilization.

FIG. 1 is a block diagram that schematically illustrates a wireless communication system 20, in accordance with an embodiment that is described herein. System 20 comprises a wireless communication terminal 24, also referred to as User Equipment (UE), which communicates with a Base Station (BS) 28. UE 24 may comprise, for example, a cellular phone, a wireless-enabled laptop, Personal Digital Assistant (PDA) or other computer, or any other suitable communication or computing platform having wireless communication capabilities. Although FIG. 1 shows a single UE and a single BS for the sake of clarity, a typical communication system may comprise multiple BSs and multiple UEs.

The embodiments described herein refer mainly to Universal Mobile Telecommunications System (UMTS) UEs and BSs, but the methods and systems described herein can also be used in UEs and BSs conforming to any other suitable communication standard or protocol, such as Code Division Multiple Access (CDMA), CDMA2000, Wideband CDMA (WCDMA), Long Term Evolution (LTE), LTE Advanced, Global System for Mobile communications (GSM) and others.

UE 24 comprises a transmitter 32 for transmitting uplink signals to BS 28, and a receiver 36 for receiving downlink signals from the BS. Transmission and reception of the signals is performed via an antenna 40. BS 28 and UE 24 operate an uplink power control process, in which the BS sends suitable power control signaling, such as Transmit Power Control (TPC) commands, to the UE. The TPC commands instruct the UE to adjust its output power, i.e., the power level at which the uplink signals should be transmitted to the BS. In some embodiments, the uplink signal may comprise multiple different channels. UE may be requested to change its output power by changing the weights of the different channels comprised in the uplink signal (e.g., when a data service is modified).

Upon receiving a TPC command (or other signaling request for changing output power) by receiver 36, the UE modifies its output power by setting the appropriate gain value of transmitter 32, using methods that are described in detail below. In particular, these methods compute the actual gain of the transmitter with high speed and accuracy, and thus enable fast and accurate uplink power control operation.

Transmitter 32 comprises a baseband unit 44. The baseband unit typically accepts data for transmission over the uplink, and modulates the data using a certain modulation scheme. In the present example, the UE comprises a UMTS UE, and the uplink signal is modulated in accordance with a Wideband Code Division Multiple Access (WCDMA) modulation. Alternatively, however, various other suitable modulation schemes can also be used.

In the example seen in FIG. 1, baseband unit 44 produces a digital baseband signal comprising a stream of digital samples. In a UMTS transmitter, the digital signal may have a sampling rate of 15.36 MHz, although any other suitable sampling rate can also be used. Unit 44 may perform other functions that are normally performed in digital transmitters, such as Error Correction Coding (ECC), interleaving, scrambling, digital filtering and/or and other suitable signal processing operations. In particular, baseband unit 44 comprises a digital gain module 48, which controls the gain of the digital signal flowing through it. The digital gain of module 48 is variable and externally-configurable, and may be used in a process that adjusts the gain of transmitter 32. The digital signal produced by unit 44 is converted into an analog baseband signal using a Digital-to-Analog Converter (DAC—not shown in the figure).

Transmitter 32 further comprises a Radio Frequency (RF) unit 52. The RF unit accepts the analog baseband signal, up-converts the signal to the desired transmission frequency and amplifies the signal to the appropriate output power. The RF unit typically comprises elements such as mixers, filters and amplifiers. In particular, RF unit 52 comprises an analog gain module 56, which controls the gain of the analog signal flowing through it. The gain of module 56 is variable and externally-configurable, and may be used in a process that adjusts the gain of transmitter 32. Module 56 may comprise, for example, a Voltage Variable Attenuator (VVA), a Digitally-Controlled Attenuator (DCA), a Programmable-Gain Amplifier (PGA) or any other suitable variable-gain component. The RF signal produced by RF unit 52 has the desired output power, which is set by controlling module 48 and/or module 56. The signal is transmitted to BS 28 via antenna 40.

The signal path in UE 24 that produces and processes the uplink signal is referred to herein as a transmission chain or transmitter. The transmission chain typically begins at the point the data is provided for transmission, and ends at the UE antenna. In the present example, the transmission chain in UE 24 comprises baseband unit 44 and RF unit 52. The terms "transmission chain" and "transmitter" are sometimes used interchangeably.

As noted above, UE 24 adjusts the output power of transmitter 32 in response to TPC commands received from BS 28. The TPC commands typically request relative power adjustments, i.e., instruct the UE to increase or decrease its output power by a certain step, e.g., by 1 dB or 2 dB. In many communication standards that employ uplink power control, the UE is required to set its output power with high accuracy and within specified time constraints. For example, sections 6.5.3-6.5.5 of the 3GPP TS 25.101 specification, cited above, specify the accuracy and timing requirements of output power setting in UMTS UEs.

The actual output power at the output of RF unit 52, however, depends on the actual gain of the transmission chain. This gain may vary considerably, relative to the values derived from the calibrated control characteristics, due to changes in temperature, transmit frequency, supply voltage, component aging and other factors. These unpredictable gain variations degrade the accuracy of the power control process, and this inaccuracy may prevent the UE from meeting the specified accuracy requirements.

In some embodiments that are described herein, UE 24 measures the actual gain of the transmission chain with high accuracy and at high speed. The UE then computes the gain correction to be applied in response to a given TPC command based on the measured actual gain. By using these techniques, the UE compensates for gain variations in the transmitter and is therefore able to set the transmitter output power accurately.

Figure 2:
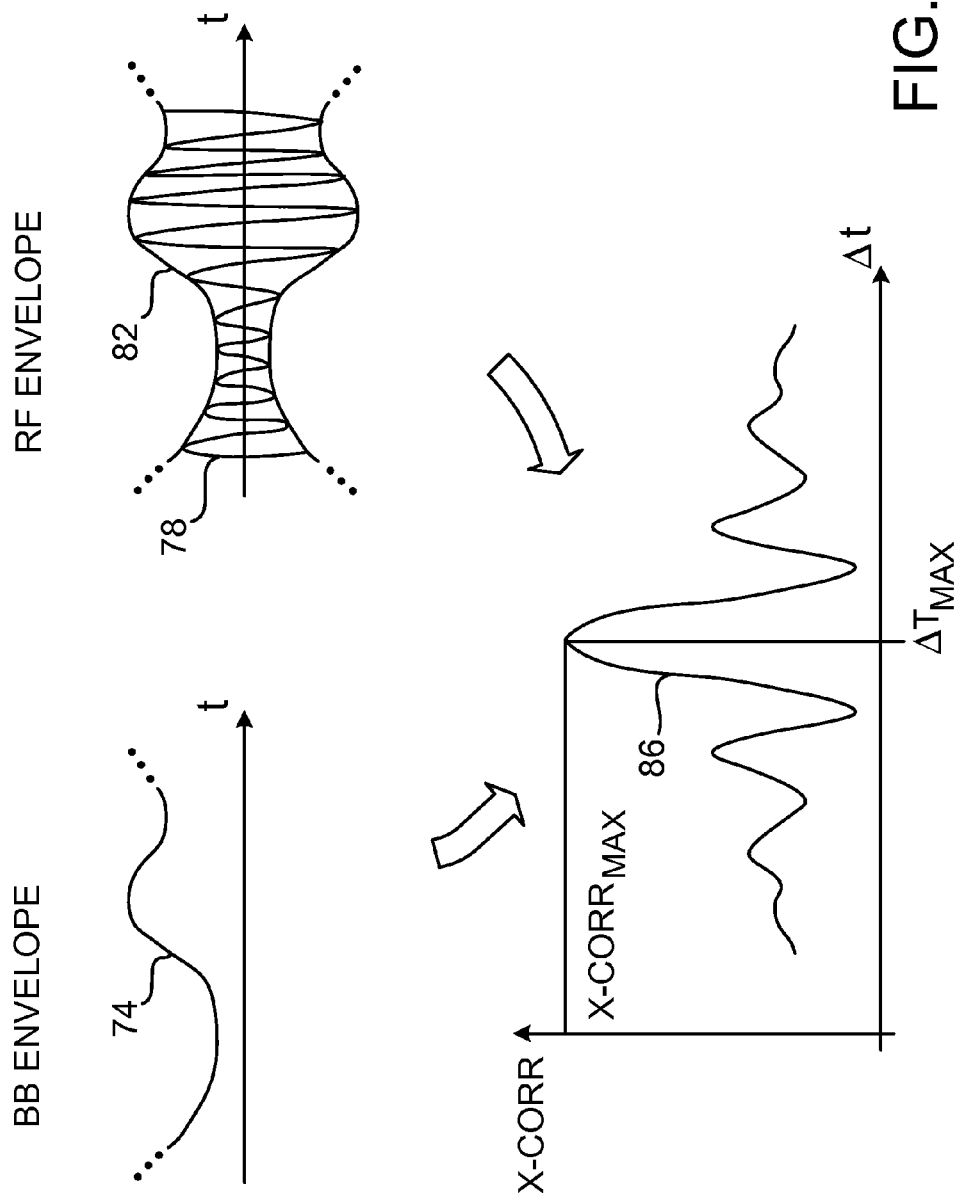
FIG. 2 is a diagram that schematically illustrates a cross-correlation between a baseband signal envelope and a Radio Frequency (RF) signal envelope, in accordance with an embodiment that is described herein.

In an embodiment, the UE measures the transmitter gain by determining the envelope of the uplink signal at two measurement points along the transmission chain. The signal envelopes may be derived with or without smoothing (by filtering, for example). A graphical example of signals and their respective envelopes is shown in FIG. 2 below. The term "signal envelope" is a well-known term, which refers to an imaginary boundary (curve) within which the signal is contained when viewed in time domain. This boundary typically has an upper and lower part. The embodiments described herein usually consider the upper boundary of the envelope. In a baseband signal representation in which the signal is represented by In-phase (I) and Quadrature (Q) components, the envelope can be expressed as $SQRT(I^2+Q^2)$. Other suitable representations of signals, calculated using a different formula, obtained at different measurement points along the transmission chain may also be used. Reference herein to envelopes may include other such suitable signal representations.

In the present example, one point for determining the signal envelope is located in baseband unit 44 and the other point is located in RF unit 52. UE 24 comprises a baseband digital envelope detector 60, which calculates the envelope of the digital sample stream that represents the uplink signal at a certain point in unit 44, for example at or near the input of digital gain unit 48. Detector 60 may comprise any suitable circuitry, and is typically integrated in baseband unit 44. Typically, the digital uplink signal is represented by two parallel streams of In-phase (I) and Quadrature (Q) samples, and envelope detector 60 computes or approximates the complex envelope of the baseband signal (i.e., the square root of $I^2+Q^2$). Envelope detector 60 typically produces a stream of digital samples, whose magnitudes correspond to the envelope of the digital uplink signal.

UE 24 further comprises an RF analog envelope detector 64, which samples the analog uplink signal at a certain measurement point in RF unit 52 and determines the envelope of the RF analog signal. Envelope detector 64 may comprise any suitable detector type, such as a diode-based detector. The measurement point used for determining this envelope is typically located as close as possible to antenna 40, in order to capture gain variations in as many transmitter elements as possible. For example, when the RF unit comprises a Power Amplifier (PA) that amplifies the uplink RF signal to its designated output power, the sampling point may be located between the PA and the antenna.

Envelope detectors 60 and 64 derive the envelopes of the uplink signal at two respective measurement points along the transmission chain. The magnitude ratio between the two envelopes is indicative of the actual gain between the two measurement points. Note, however, that the magnitudes of the two signal envelopes vary over time, and that the magnitude ratio is indicative of the gain when the two envelopes are time-aligned with one another. UMTS signals are especially sensitive to time alignment, since these signals typically have a high Peak to Average Ratio (PAR) and their envelopes change rapidly with time.

UE 24 comprises a calculation unit 68, which computes a cross-correlation between the two signal envelopes, finds the maximum value of the cross-correlation, and normalizes this maximum value by the average power of the baseband signal envelope. The normalized maximum value of the cross-correlation is indicative of the actual gain between the two measurement points. Computing the gain based on a maximum of the cross-correlation provides highly accurate time alignment between the two envelopes. The cross-correlation is also relatively insensitive to linear and non-linear distortion in the uplink signal (e.g., distortion caused by filters or amplifiers), which may differ from one measurement to another.

Unit 68 accepts from detector 60 a first sample stream representing the envelope of the uplink signal at the first measurement point. Unit 68 further accepts from detector 64 a second sample stream, which represents the envelope of the uplink signal at the second measurement point. (The output of the analog envelope detector is typically sampled using an analog-to-digital converter that is not shown in the figure, in order to produce the second sample stream. The sampling rates of the two streams are typically equal.)

Calculation unit 68 computes the cross correlation between the first and second sample streams, i.e., the cross-correlation between the two uplink signal envelopes. Unit 68 then calculates the actual gain between the first and second measurement points by evaluating the expression:

$$ActualGain = \frac{\max_d \left\{ \sum_{i=0}^{L} BBEnv(i) \times RFEnv(i-d) \right\}}{\sum_{i=0}^{L} BBEnv(i)^2} \quad \text{Equation 1}$$

wherein $BBEnv(i)$ denotes the first sample stream (i.e., the envelope of the baseband signal at the first measurement point) and $RFEnv(i)$ denotes the second sample stream (i.e., the envelope of the RF signal at the second measurement point). As can be seen in Equation 1 above, the actual gain is computed by evaluating the cross-correlation between $BBEnv(i)$ and $RFEnv(i)$, and dividing the maximum value of the cross-correlation by the average power of $BBEnv(i)$.

The actual gain of the transmission chain, which is calculated by unit 68 using the above-described method, is used for adjusting the output power of transmitter 32 in response to TPC commands received from the BS. In a typical flow, receiver 36 receives a TPC command from BS 28, extracts the requested output power change from the command, and provides this information to unit 68. Unit 68 calculates the appropriate gain correction, which is to be applied to the transmission chain in order to achieve the requested output power change. Unit 68 calculates the gain correction based on the measured actual gain of the transmission chain relative to the desired gain setting. The gain correction may be different from the output power change requested in the command since the actual gain of the transmission chain may vary, relative to the calibrated value, for different operating conditions.

Having calculated the actual gain, calculation unit 68 produces a gain correction, which is to be applied to the transmission chain in response to the TPC command. The gain correction may be applied to the digital uplink signal by controlling digital gain module 48. Alternatively, the gain correction may be applied to the analog uplink signal by controlling analog gain module 56. Further alternatively, the gain correction can be divided between the digital and analog gain modules. Since the gain correction is computed based on the actual gain of the transmission chain, which is measured using the actual uplink signal that is transmitted by the transmitter at the actual operating conditions, the transmitter output power is set with high accuracy.

The configuration of UE 24 shown in FIG. 1 is an example configuration, which is chosen for the sake of conceptual clarity. In alternative embodiments, any other suitable UE configuration can be used. In particular, any other form of transmission chain can be used, and the measurement points can be located at other suitable locations along the chain. For example, both measurement points may be located in the analog part of the transmission chain, i.e., in RF unit 52. Baseband unit 44 may be implemented, for example, using one or more Integrated Circuits (ICs). RF unit 52 may be implemented, for example, using one or more RFICs. Envelope detectors 60 and 64 and calculation unit 68 are referred to herein collectively as control circuitry, which carry out the methods described herein. The control circuitry may be implemented using hardware or firmware as desired. In some embodiments, some functions of unit 68 may be implemented using software.

FIG. 2 is a diagram that schematically illustrates a cross-correlation between a baseband signal envelope and a Radio Frequency (RF) signal envelope, in accordance with an embodiment that is described herein. FIG. 2 shows a digital baseband signal envelope 74, and an RF signal 78 having an envelope 82. Envelopes 74 and 82 may be produced by envelope detectors 60 and 64 of FIG. 1, respectively. A plot 86 shows the cross-correlation between envelopes 74 and 82, as computed by calculation unit 68. Unit 68 typically determines sequences $BBEnv(i)$ and $RFEnv(i)$, as described above, and computes the cross-correlation $\Sigma BBEnv(i) \cdot RFEnv(i-d)$ between the two sequences. The maximum value of the cross-correlation is denoted $X\_CORR_{MAX}$ and occurs at a time offset denoted $\Delta T_{MAX}$. As explained above, dividing $X\_CORR_{MAX}$ by the average power of envelope 74 produces an estimate of the actual transmitter gain between the two measurement points.

Figure 3:
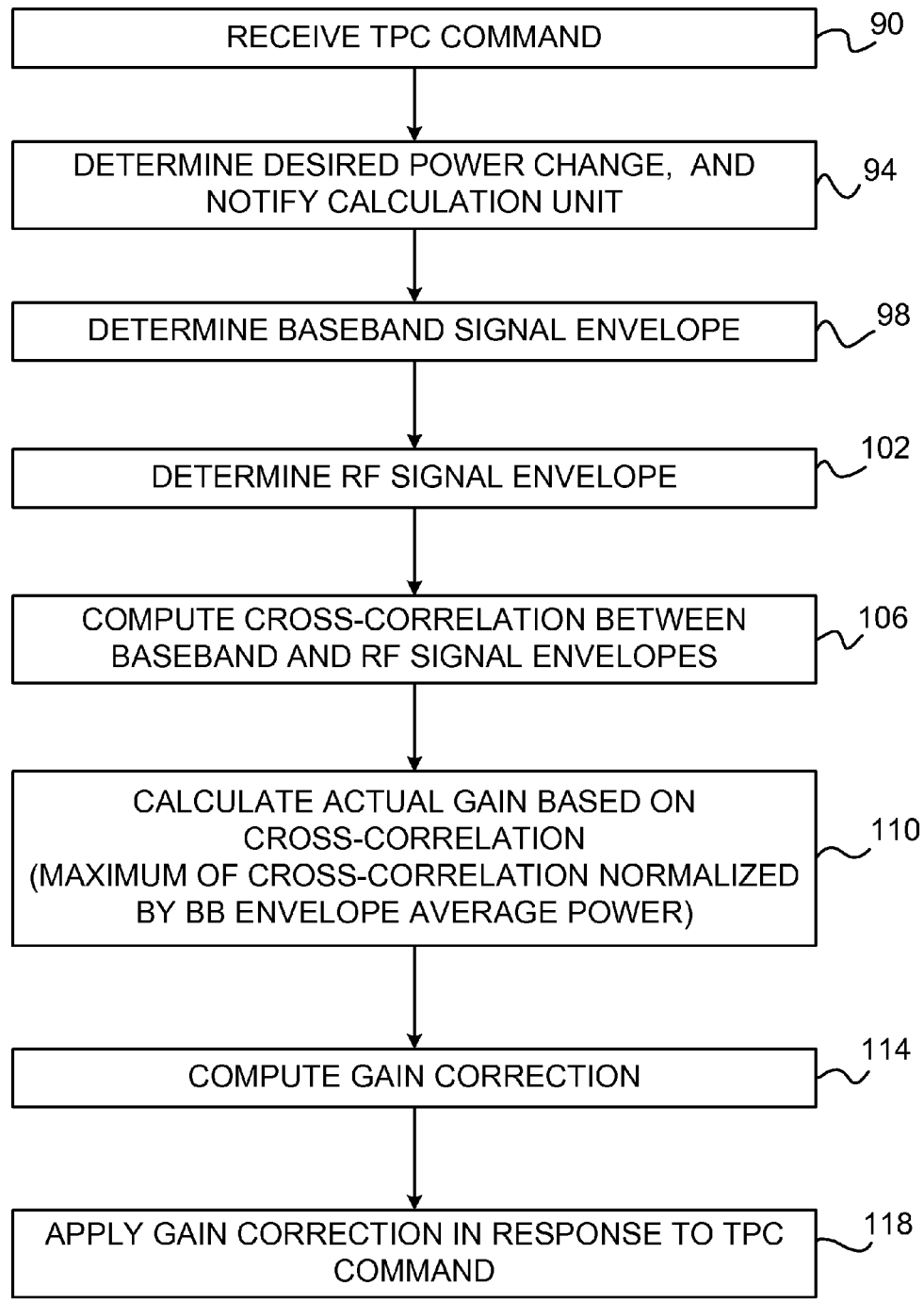
FIG. 3 is a flow chart that schematically illustrates a method for power control in a wireless communication terminal, in accordance with an embodiment that is described herein.

FIG. 3 is a flow chart that schematically illustrates a method for power control in UE 24, in accordance with an embodiment that is described herein. The method begins with receiver 36 of UE 24 receiving a TPC command from BS 28, at a command reception operation 90. The TPC command instructs the UE to change its output power by a certain amount, e.g., by 1 dB or 2 dB. The receiver extracts the requested output power change from the TPC command, at a command extraction operation 94. The receiver notifies calculation unit 68 of the new requested gain value or the required gain (power) change relative to the desired gain setting.

Upon receiving the notification, digital envelope detector 60 determines the envelope of the uplink baseband signal, at a baseband envelope generation operation 98. Analog envelope detector 64 determines the envelope of the uplink RF signal, at an RF envelope generation operation 102. In some embodiments, the two envelope detectors determine the uplink signal envelopes continuously, and unit 68 reads and processes the envelopes upon receiving the notification from the receiver. Alternatively, unit 68 may trigger the envelope detectors to provide the respective envelopes at the appropriate time.

Unit 68 computes the cross-correlation between the baseband signal envelope and the RF signal envelope, at a cross-correlation computation operation 106. Unit 68 computes the actual gain of the transmission chain based on the cross-correlation, at an actual gain computation operation 110. As explained above, unit 68 identifies the maximum value of the cross-correlation and divides it by the average power of the baseband signal envelope. The resulting value is used as an estimate of the actual transmitter gain.

Unit 68 calculates the gain correction to be applied in response to the TPC command, at a correction calculation operation 114. Unit 68 calculates the gain correction based on (1) the requested power change received in the TPC command, and (2) the actual gain of the transmitter. The gain correction calculation can also be implemented by defining a desired gain between the two sampling points, and calculating a difference between the desired gain and the actual gain. Unit 68 applies the computed gain correction, at a gain adjustment operation 118. At this stage, the output power of UE 24 is adjusted by the amount requested in the TPC command with high accuracy.

Some communication standards and protocols allocate dedicated time intervals for power control and stabilization in the UE. The output power of the UE is typically allowed to deviate somewhat from its steady-state value during these time intervals. In some embodiments, unit 68 carries out the method of FIG. 3 during these time intervals.

For example, in accordance with the 3GPP TS 25.101 specification, cited above, the uplink signal is transmitted continuously, and the data is organized in time slots. The specification allocates transient periods at the slot boundaries for output power control and stabilization. In some embodiments, UE 24 carries out the method of FIG. 3 during a given transient period, and transmits at the resulting constant output power in the subsequent time slot. A cycle of gain computation and gain correction, using the method of FIG. 3, can be completed in a sufficiently short time that enables the output power adjustment process to be completed at least once within the designated transient period.

In some embodiments, unit 68 may repeat the process of measuring the actual gain and computing and setting the gain correction several times in response to a given TPC command (e.g., during a given transient period). The repeated process further increases the accuracy of the output power setting for the next time slot. In some embodiments, the gain correction process may continue beyond the specified transient periods, particularly when two or more iterations are performed. When the correction process is repeated several times, subsequent gain corrections can be applied in a differential manner, i.e., relative to the previous gain setting.

In some embodiments, UE 24 holds a predefined (e.g., pre-calibrated) dependence of the transmitter gain as a function of output power. In these embodiments, upon receiving a TPC commands, unit 68 first applies an initial gain correction based on the predefined dependence, and then enhances the initial gain setting based on the actual gain measurement using the method of FIG. 3. In some embodiments, UE 24 may record the gain corrections applied at different power levels and operating conditions (e.g., temperature, transmit frequency or supply voltage) for future use. When the UE observes similar operating conditions at a later point in time, it may apply the recorded gain setting that is applicable at these operating conditions and output power level.

Figure 4:
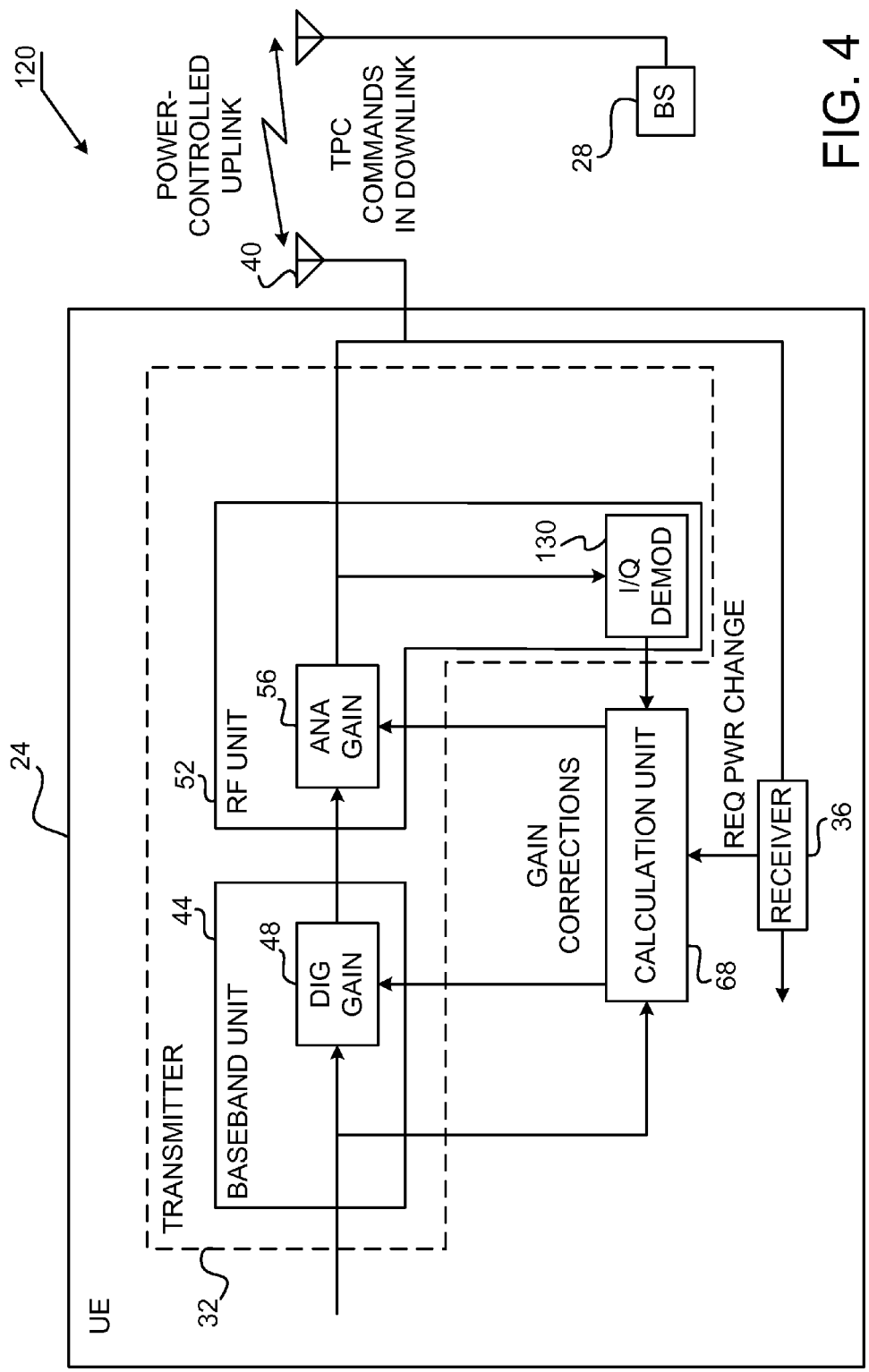
FIGS. 4 and 5 are block diagrams that schematically illustrate wireless communication systems, in accordance with alternative embodiments that are described herein.

FIG. 4 is a block diagram that schematically illustrates a wireless communication system 120, in accordance with an alternative embodiment that is described herein. In this embodiment, RF unit 52 comprises an integrated I/Q demodulator 130, which down-converts the RF signal, produced by the transmitter PA, to baseband. The output of I/Q demodulator 130, which comprises a baseband representation of the RF signal at the PA output, is provided to calculation unit 68. Additionally, calculation unit 68 accepts a second baseband representation of the uplink signal—a digital baseband signal from baseband unit 44.

The two measurement points shown in FIG. 4 are chosen merely by way of example. In alternative embodiments, unit 68 may accept the baseband representations of the uplink signal from any other suitable measurement points at the input and the output of the transmission chain of transmitter 32, respectively. Each baseband representation typically comprises a complex baseband signal.

In an embodiment, calculation unit 68 computes a cross-correlation between the two baseband representations of the uplink signal, and computes the actual gain of transmitter 32 based on the cross-correlation. (If the baseband representation is analog, such as the output of I/Q demodulator 130, unit 68 typically digitizes the analog signal before computing the cross-correlation).

In one embodiment, calculation unit 68 computes the actual transmitter gain according to:

Equation 2:

$$ActualGain = \frac{\left|\sum_{i}^{L} InputSig * Conj(IQDemodOut)\right|}{\sum_{1}^{L} InputSig * Conj(InputSig)}$$

wherein InputSig denotes the digital baseband signal provided to unit 68 from baseband unit 44, IQDemodOut denotes the output of I/Q demodulator 130, Conj denotes complex conjugation, and L denotes the number of signal samples over which the cross-correlation is computed.

The other functions of system 120 of FIG. 4 are similar to those of system 20 of FIG. 1 above. As described above, unit 68 typically finds the maximum of the cross-correlation, and normalizes this maximal value by the average power of the baseband signal received from unit 44. In some embodiments, unit 68 of FIG. 4 computes the envelopes of the two baseband signal representations, and performs the cross-correlation between the two envelopes.

Other functions of UE 24, such as the type of gain corrections, the timing of gain computation and correction, and system aspects such as responding to TPC commands, are similar to the functions described above with respect to system 20 of FIG. 1.

Figure 5:
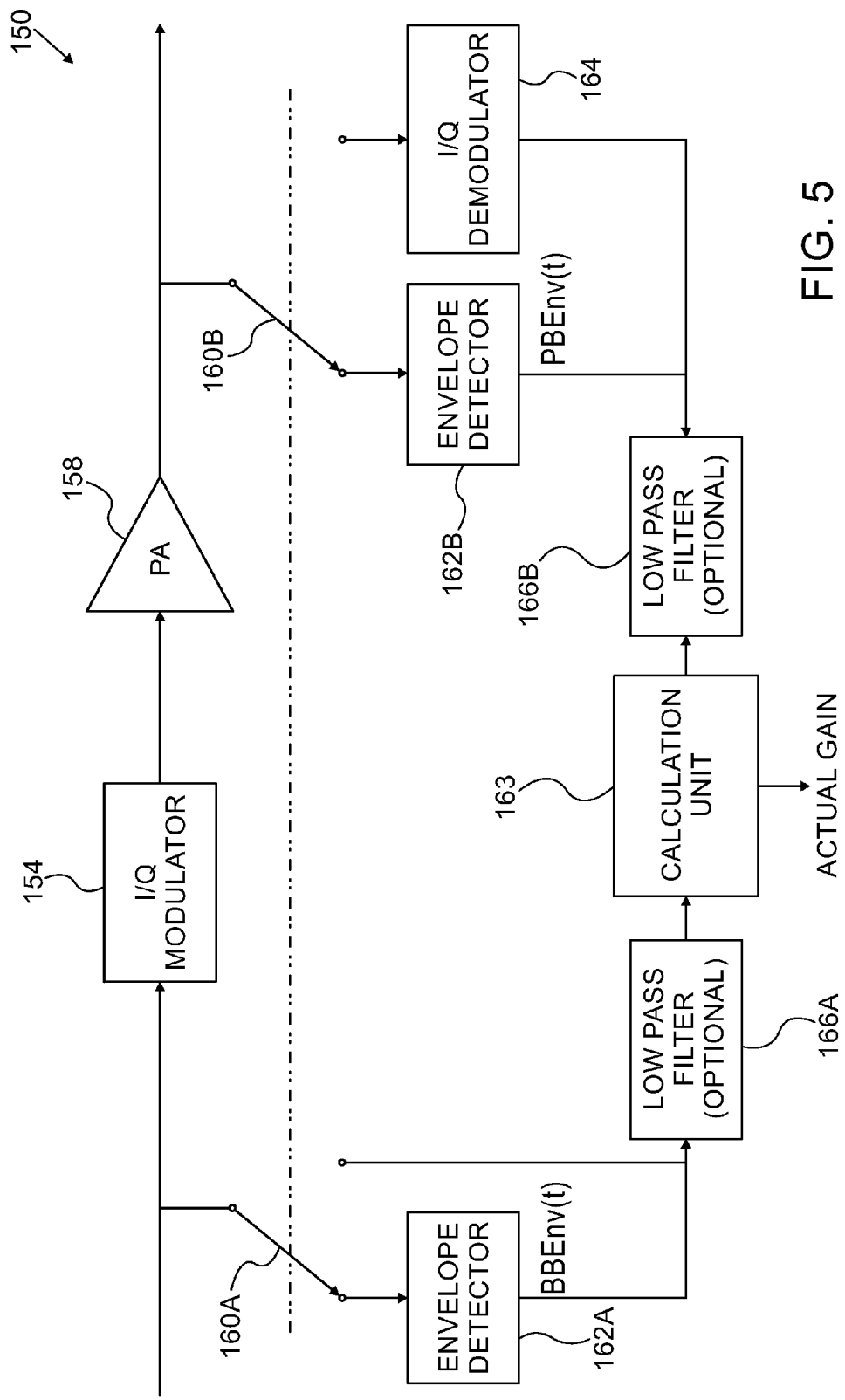

FIG. 5 is a block diagram that schematically illustrates a wireless communication system 150, in accordance with yet another embodiment that is described herein. In this embodiment, the transmission chain comprises an I/Q modulator 154 and a PA 158. The signal is measured at two measurement points, at the input and output of the transmission chain. A calculation unit 163 calculates the actual transmitter gain based on the two signals, using the methods described above. A pair of switches 160A and 160B route the signals that are obtained at the two measurement points to two alternative processing paths for estimating the actual transmitter gain by unit 163.

In one setting of switches 160A and 160B, the measured signals are processed by respective envelope detectors 162A and 162B, similarly to the configuration of FIG. 1 above. In some embodiments, Low-Pass Filters (LPFs) 166A and 166B apply low-pass filtering to the signal envelopes produced by envelope detectors 162A and 162B, respectively. The low-pass-filtered signals are then provided to unit 163 for gain calculation. In other embodiments, unit 163 accepts the signal envelopes without low-pass filtering, and LPFs 166A and 166B are omitted.

In the other setting of switches 160A and 160B, the signal from the input of the transmission chain is provided to calculation unit 163 without envelope detection, optionally after filtering by LPF 166A. An I/Q demodulator 164 down-converts the signal from the output of the transmission chain. The output of the I/Q demodulator is provided to calculation unit 163 without envelope detection, optionally after filtering by LPF 166B. Other than the optional low-pass filtering, this configuration is similar to the configuration of FIG. 4 above.

Although the embodiments described herein mainly address uplink power control in UMTS UEs, the principles of the present disclosure can also be used for other applications, such as CDMA, CDMA2000, WCDMA, LTE, LTE-Advanced, GSM and others.

It will thus be appreciated that the embodiments described above are cited by way of example, and that the present disclosure is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for controlling output signal power in a communication terminal, the method comprising:
accepting, from first and second measurement points along a transmission chain in a transmitter of the terminal, respective first and second signal representations of a communication signal to be transmitted by the communication terminal;
selecting whether to route the first and second signal representations to a first processing path that detects respective first and second envelopes of the first and second signal representations, or to a second processing path that does not apply envelope detection to the first and second signal representations;
time-aligning the first and second signal representations, or the first and second envelopes, depending on the selected processing path;
computing an actual gain between the first and second measurement points using the time-aligned first and second signal representations or first and second envelopes; and
adjusting an output power of the communication signal by setting a gain of the transmitter responsively to the actual gain.

2. The method according to claim 1, wherein accepting the first and second signal representations comprises accepting first and second baseband representations at the first and the second measurement points, respectively.

3. The method according to claim 2, wherein accepting the baseband representations comprises accepting the second baseband representation from an I/Q demodulator that down-converts a Radio Frequency (RF) signal at the second measurement point.

4. The method according to claim 1, wherein accepting the signal representations comprises applying low-pass filtering to the first and second signal representations or to the first and second envelopes before time-aligning.

5. The method according to claim 1, wherein computing the actual gain comprises determining a maximum of a cross-correlation between the first and second signal representations, measuring an average power of the first signal representation and normalizing the maximum of the cross-correlation by the average power.

6. The method according to claim 1, wherein adjusting the output power comprises receiving a request from a base station to adjust the output power, and adjusting the output power responsively to the request.

7. The method according to claim 1, wherein adjusting the output power comprises determining a desired gain setting between the first and second measurement points, and correcting the output power responsively to a difference between the desired gain setting and the actual gain.

8. The method according to claim 1, wherein adjusting the output power comprises initially adjusting the output power based on predefined gain values, and correcting the initially-adjusted output power responsively to the computed actual gain.

9. The method according to claim 1, comprising processing the communication signal by the transmission chain so as to transmit the communication signal at the adjusted output power.

10. The method according to claim 1, wherein accepting the signal representations comprises accepting the representations of the communication signal that is modulated in accordance with a Code-Division Multiple Access (CDMA) modulation.

11. The method according to claim 1, wherein accepting the signal representations comprises accepting the representations of the communication signal that is modulated in accordance with a Long Term Evolution (LTE) specification.

12. The method according to claim 1, wherein accepting the signal representations comprises accepting the first signal representation derived from a digital signal at the first measurement point, and accepting the second signal representation derived from an analog signal at the second measurement point.

13. The method according to claim 1, wherein adjusting the output power comprises controlling at least one variable-gain component in the transmission chain.

14. The method according to claim 1, wherein the communication signal conforms to a communication protocol that assigns time intervals for power control and stabilization, and wherein accepting the signal representations, time-aligning the signal representations or envelopes, computing the actual gain and adjusting the output power are performed during the time intervals.

15. A communication apparatus, comprising:
a transmission chain, which is operative to process and transmit a communication signal at a requested output power; and control circuitry, which is configured to accept, from first and second measurement points along the transmission chain, respective first and second signal representations of a communication signal to be transmitted by the communication terminal, to select whether to route the first and second signal representations to a first processing path that detects respective first and second envelopes of the first and second signal representations, or to a second processing path that does not apply envelope detection to the first and second signal representations, to time-align the first and second signal representations or the first and second envelopes, depending on the selected processing path, to compute an actual gain between the first and second measurement points using the time-aligned first and second signal representations or first and second envelopes, and to adjust an output power of the communication signal by setting a gain of the transmitter responsively to the actual gain.

16. The apparatus according to claim 15, wherein the control circuitry is configured to accept first and second baseband representations at the first and the second measurement points, respectively.

17. The apparatus according to claim 16, wherein the transmission chain comprises an I/Q demodulator that is configured to down-convert a Radio Frequency (RF) signal at the second measurement point so as to produce the second signal representation, and wherein the control circuitry is configured to accept the second baseband representation from the I/Q demodulator.

18. The apparatus according to claim 15, wherein the transmission chain comprises first and second low-pass filters that are configured to apply low-pass filtering to the first and second signal representations or to the first and second envelopes, and wherein the control circuitry is configured to time-align the first and second signal representations or the first and second envelopes following the low-pass filtering.

19. The apparatus according to claim 15, wherein the control circuitry is configured to compute the actual gain by determining a maximum of a cross-correlation between the first and second signal representations, measuring an average power of the first signal representation and normalizing the maximum of the cross-correlation by the average power.

20. The apparatus according to claim 15, wherein the control circuitry is configured to determine a desired gain setting between the first and second measurement points, and to correct the output power responsively to a difference between the desired gain setting and the actual gain.

21. The apparatus according to claim 15, wherein the communication signal conforms to a communication protocol that assigns time intervals for power control and stabilization, and wherein the control circuitry is configured to accept the signal representations, to time-align the signal representations or the envelopes, to compute the actual gain and to adjust the output power during the time intervals.

22. A mobile communication terminal comprising the apparatus of claim 15.

23. A chipset for processing signals in a mobile communication terminal, comprising the apparatus of claim 15.

* * * * *